US008742575B2

(12) United States Patent
Ogumi

(10) Patent No.: US 8,742,575 B2
(45) Date of Patent: Jun. 3, 2014

(54) SEMICONDUCTOR DEVICE AND FABRICATION METHOD THEREOF

(75) Inventor: Taiichi Ogumi, Kanagawa (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 109 days.

(21) Appl. No.: 12/801,798

(22) Filed: Jun. 25, 2010

(65) Prior Publication Data

US 2011/0001234 A1    Jan. 6, 2011

(30) Foreign Application Priority Data

Jul. 6, 2009    (JP) .................... 2009-159560

(51) Int. Cl.
*H01L 23/48*    (2006.01)
*H01L 23/52*    (2006.01)
*H01L 29/40*    (2006.01)

(52) U.S. Cl.
USPC ............ 257/736; 257/737; 257/750

(58) Field of Classification Search
CPC .......... H01L 2224/48227; H01L 2224/73265; H01L 2224/32145; H01L 2224/73204; H01L 2224/97
USPC ......... 257/734, 735, 736, 737, 738, 773, 774, 257/775, 776, 750, 758, E23.001, E23.01, 257/E23.011, E23.02, E23.024; 438/638
See application file for complete search history.

(56) References Cited

U.S. PATENT DOCUMENTS

| | | | | |
|---|---|---|---|---|
| 5,463,255 A | * | 10/1995 | Isono | 257/773 |
| 6,013,951 A | * | 1/2000 | Ishida et al. | 257/750 |
| 6,103,552 A | * | 8/2000 | Lin | 438/113 |
| 6,380,003 B1 | * | 4/2002 | Jahnes et al. | 438/131 |
| 6,815,324 B2 | * | 11/2004 | Huang et al. | 438/612 |

FOREIGN PATENT DOCUMENTS

| | | |
|---|---|---|
| JP | 06-168947 A | 6/1994 |
| JP | 2000-235979 A | 8/2000 |
| JP | 2008-021849 A | 1/2008 |

OTHER PUBLICATIONS

Japanese Patent Office Action issued Dec. 18, 2012 and the English Translation thereof.

* cited by examiner

*Primary Examiner* — Colleen Matthews
*Assistant Examiner* — Quovaunda V Jefferson
(74) *Attorney, Agent, or Firm* — Rabin & Berdo, P.C.

(57) ABSTRACT

Disclosed is a semiconductor device that comprises a first insulating film provided on a main face of a semiconductor substrate; a first pedestal provided at a first wiring layer on the first insulating layer; a second insulating film provided on the first wiring layer; and a second pedestal provided at a second wiring layer on the second insulating film, wherein, when the first and second pedestals are projected in a direction perpendicular to the main face onto a plane parallel to the main face, the second pedestal is larger than the first pedestal, and the whole of the first pedestal is disposed at an inside of the second pedestal.

9 Claims, 8 Drawing Sheets

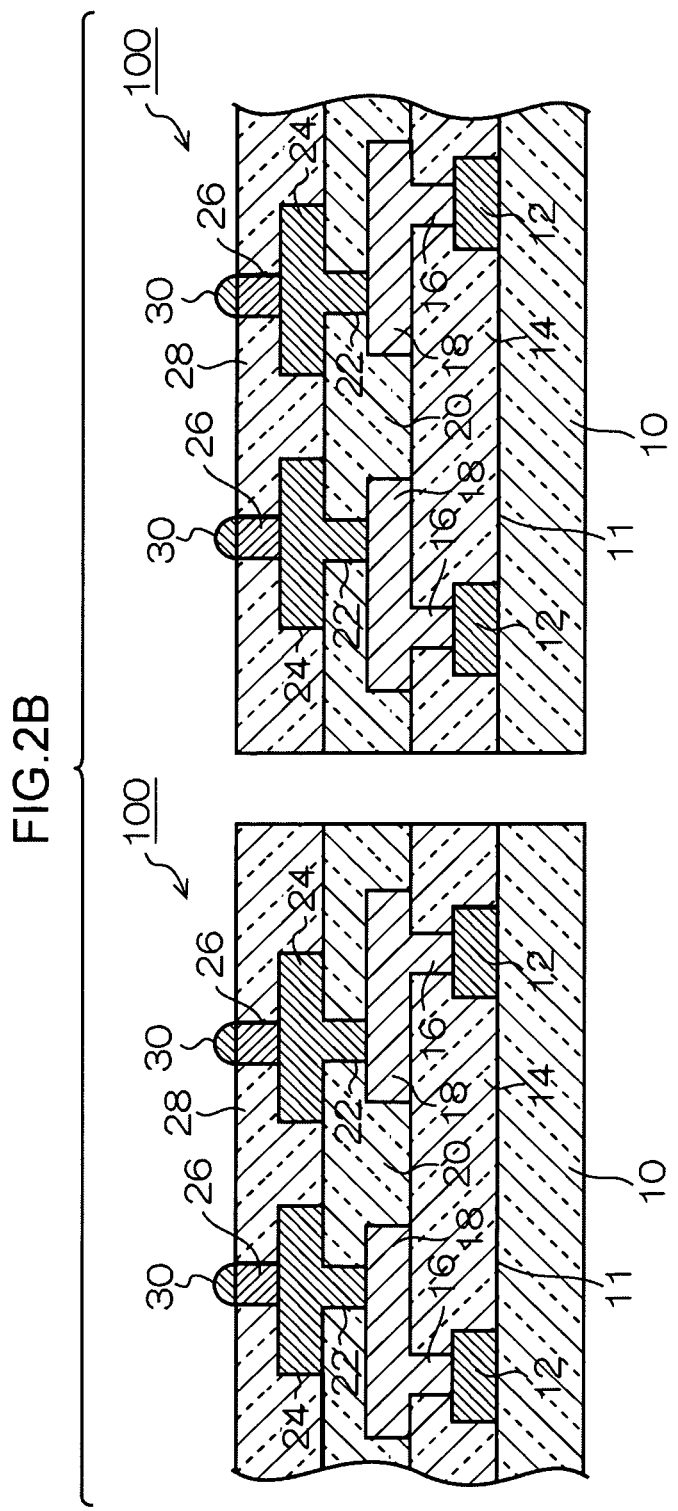

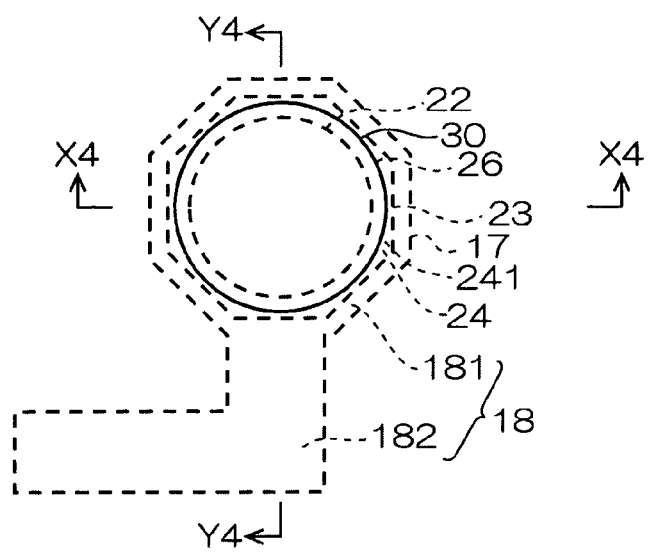
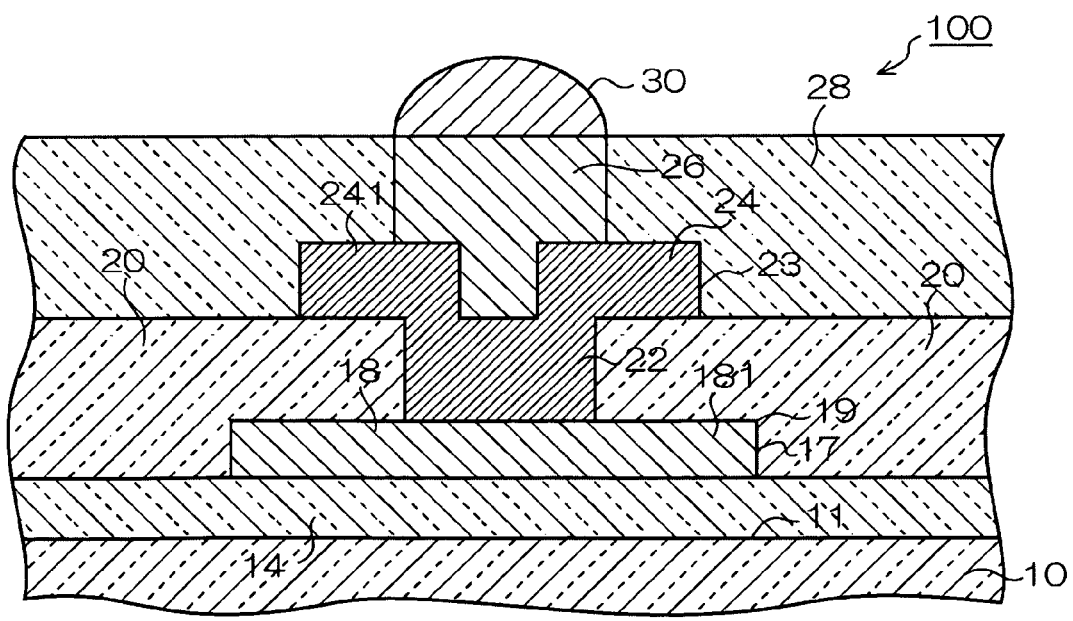

SEMICONDUCTOR DEVICE AND FABRICATION METHOD THEREOF

CROSS-REFERENCE TO RELATED APPLICATION

This application claims priority under 35 USC 119 from Japanese Patent Application No. 2009-159560 filed on Jul. 6, 2009, the disclosure of which is incorporated by reference herein.

BACKGROUND

1. Field of the Invention

The present invention relates to a semiconductor device and to a fabrication method thereof, and in particular, to a Wafer Level Chip Size Package (WCSP) and to a fabrication method thereof.

2. Related Art

Wafer level chip size packages generally adopt a structure with plural external connection terminals disposed on a chip-shaped semiconductor substrate (see Japanese Patent Application Laid-Open (JP-A) No. 2000-235979).

Conventionally, a semiconductor wafer for which pre-processing has been completed is made into individual semiconductor chips by dicing, then packaged by using, for example, bonding, a resin mold or the like. Recently, however, in order to achieve even smaller sizes and reduced thickness, the use of wafer level chip size packages is becoming prevalent, where a semiconductor wafer is diced into individual chips to form chip size packages after forming, at a wafer stage, redistribution wirings which connect between terminal pads on a semiconductor substrate surface and external connection terminals, the external connection terminals, a resin seal and the like. However, the conventional wafer level chip size packages have a problem in moisture resistance.

SUMMARY

It is, therefore, an object of the present invention to provide a semiconductor device with excellent moisture resistance, and a fabrication method thereof.

According to an aspect of the present invention, there is provided a semiconductor device including: a first insulating film provided on a main face of a semiconductor substrate; a first pedestal provided at a first wiring layer on the first insulating layer; a second insulating film provided on the first wiring layer; and a second pedestal provided at a second wiring layer on the second insulating film. In this aspect, when the first and second pedestals are projected in a direction perpendicular to the main face onto a plane parallel to the main face, the second pedestal is larger than the first pedestal, and the whole of the first pedestal is disposed at an inside of the second pedestal.

According to another aspect of the present invention, there is provided a semiconductor device including: a first insulating film provided on a main face of a semiconductor substrate; a first pedestal provided at a first wiring layer on the first insulating layer; a second insulating film provided on the first wiring layer; a second pedestal provided at a second wiring layer on the second insulating film; a through hole provided at the second insulating film; and conductive material provided inside the through hole for connecting the first pedestal with the second pedestal. In this aspect, when the first pedestal and the through hole are projected in a direction perpendicular to the main face onto a plane parallel to the main face, a surface area of an opening of the through hole is greater than a surface area of the first pedestal, and a side face of the first pedestal is disposed inside a side face of the through hole.

According to yet another aspect of the present invention, there is provided a fabrication method of a semiconductor device, the method including: providing a first insulating film on a main face of a semiconductor substrate; providing on the first insulating layer a first wiring layer that comprises a plurality of first pedestals; providing a second insulating film on the first wiring layer; providing on the second insulating film a second wiring layer that includes a plurality of second pedestals; providing a plurality of external connection members on the plurality of second pedestals, respectively; and dividing the semiconductor substrate into a plurality of sections to produce a plurality of semiconductor devices. In this aspect, for each semiconductor device, when the first and second pedestals are projected in a direction perpendicular to the main face onto a plane parallel to the main face, the second pedestal is larger than the first pedestal, and the whole of the first pedestal is disposed at an inside of the second pedestal.

BRIEF DESCRIPTION OF THE DRAWINGS

Exemplary embodiments of the present invention will be described in detail based on the following figures, wherein:

FIGS. 2A and 2B are outline vertical cross-sections for explaining a fabrication method of the semiconductor device of the first exemplary embodiment;

FIG. 4A is an outline plan view for explaining a semiconductor device of a comparative example, FIG. 4B is an outline vertical cross-section taken on line X4-X4 of FIG. 4A.

DETAILED DESCRIPTION

First Exemplary Embodiment

Figure 1A:
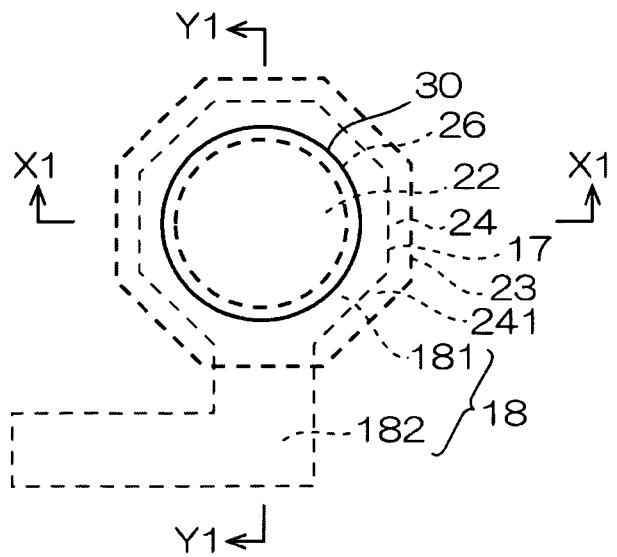
FIG. 1A is an outline plan view for explaining a semiconductor device of a first exemplary embodiment.
Figure 1B:
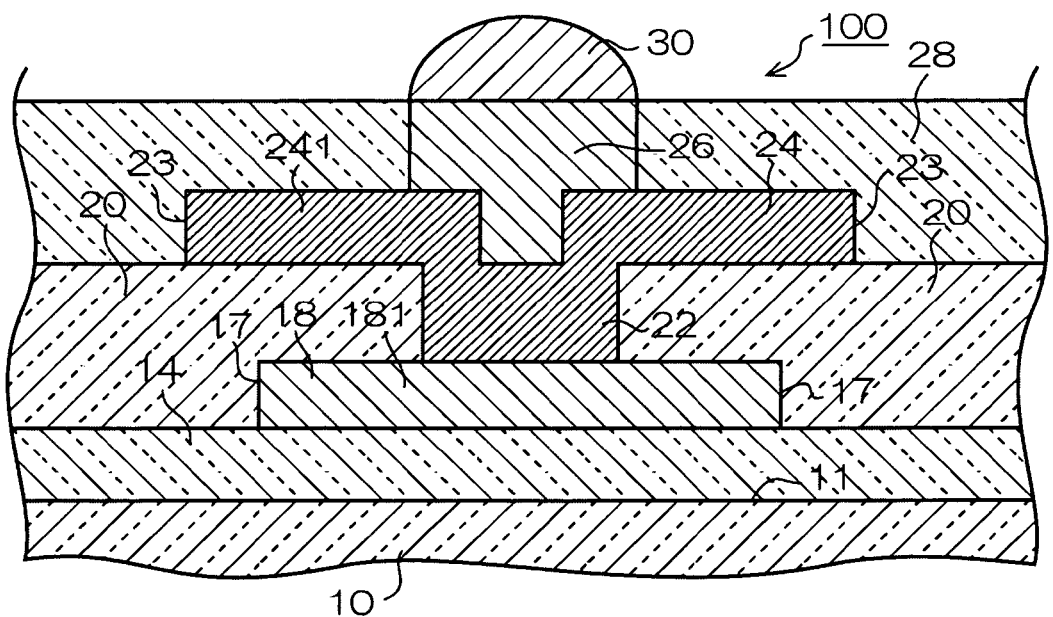
FIG. 1B is an outline vertical cross-section taken on line X1-X1 of FIG. 1A.
Figure 1C:
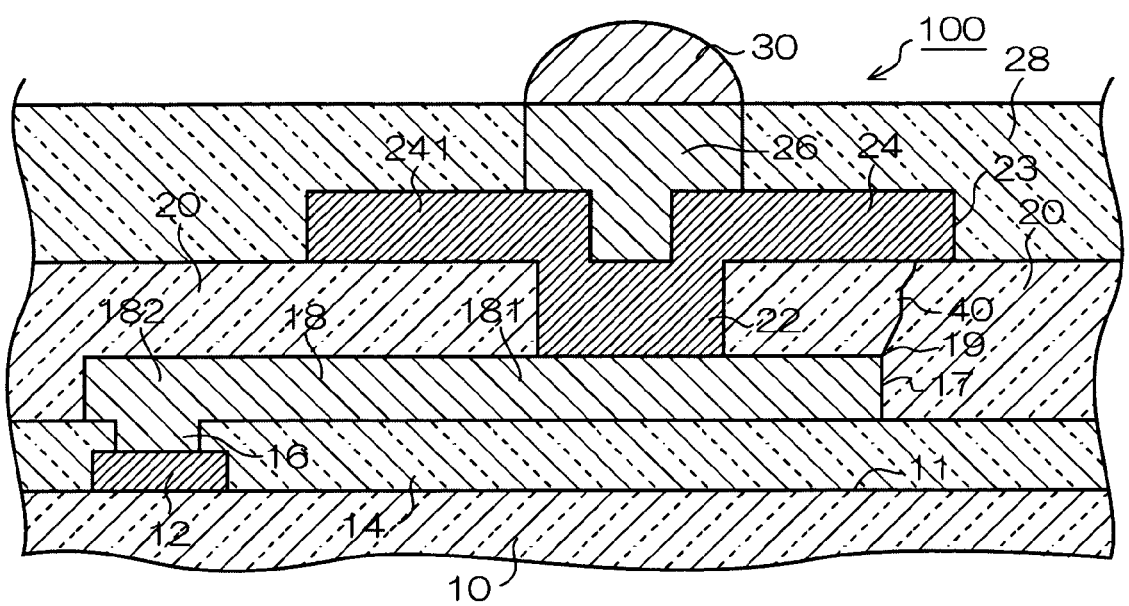
FIG. 1C is an outline vertical cross-section taken on line Y1-Y1 of FIG. 1A.

FIG. 1A is an outline plan view for explaining a semiconductor device of a first exemplary embodiment, FIG. 1B is an outline vertical cross-section taken on line X1-X1 of FIG. 1A, and FIG. 1C is an outline vertical cross-section taken on line Y1-Y1 of FIG. 1A.

In a wafer level chip size package 100 of the present exemplary embodiment, a first inter-layer insulating film 14 is provided on a main face 11 of a semiconductor silicon substrate 10, a first redistribution wiring layer 18 is provided on the first inter-layer insulating film 14, a second inter-layer insulating film 20 is provided on the first redistribution wiring layer 18, and a second redistribution wiring layer 24 is provided on the second inter-layer insulating film 20.

Elements (not shown in the figures) configuring integrated circuits, such as, for example, transistors or the like, are formed on the semiconductor silicon substrate 10. Aluminum electrode pads 12 connected to these elements are formed on the main face 11 of the semiconductor silicon substrate 10.

A wiring line 182 and a first layer pedestal 181 are provided at the first redistribution wiring layer 18, and a second layer pedestal 241 is provided at the second redistribution wiring layer 24. One end of the wiring line 182 is connected to the electrode pad 12 exposed through a through hole 16 provided at the first inter-layer insulating film 14 and, the other end thereof is connected to the first layer pedestal 181.

The first inter-layer insulating film 14 and the second inter-layer insulating film 20 are, for example, configured of polybenzoxazole (PBO).

The first redistribution wiring layer 18 and the second redistribution wiring layer 24 are formed by first forming an underlying metal layer over the entire face using, for example, a sputtering method of the like, forming, for example, a Cu layer over the entire face thereof by electroplating, followed by patterning the Cu layer formed by electroplating and then patterning the underlying metal layer. The underlying metal layer is, for example, formed of Ti and a Cu layer formed thereon.

The second layer pedestal 241 is provided directly above the first layer pedestal 181, with the second inter-layer insulating film 20 disposed therebetween. A through hole 22 is provided at the second inter-layer insulating film 20 between the first layer pedestal 181 and the second layer pedestal 241. The inside of the through hole 22 is plugged with the second layer pedestal 241. The inside of the through hole 22 can be plugged with another conductive material, other than the second layer pedestal 241. In such a case, the first layer pedestal 181 and the second layer pedestal 241 are connected together by this other conductive material. The reason that the second layer pedestal 241 is provided directly above the first layer pedestal 181, with the second inter-layer insulating film 20 disposed therebetween, is in order to relieve stress of a post electrode.

The first layer pedestal 181 is smaller than the second layer pedestal 241, and the side faces 17 of the first layer pedestal 181 are inside the side faces 23 of the second layer pedestal 241 in plan view (when projected in a direction perpendicular to the main face 11 onto a plane parallel to the main face 11). The first layer pedestal 181 and the second layer pedestal 241 are both formed in octagonal shapes in plan view.

A post electrode 26 is provided on the second layer pedestal 241 as a post electrode, the entire face is covered by a resin 28, and a solder electrode 30, made of, for example, a solder ball or the like, is formed on the post electrode 26 exposed through the resin 28. The post electrode 26 and the solder electrode 30 configure an external connection member for connecting the wafer level chip size package 100 to, for example, a printed wiring board or the like.

In the present exemplary embodiment, since the side faces 17 of the first layer pedestal 181 are disposed inside the side faces 23 of the second layer pedestal 241, even if a crack 40 develops from a top edge 19 of the side face 17 of the first layer pedestal 181, deterioration in moisture resistance can be prevented or suppressed due to the crack 40 being covered by the second layer pedestal 241.

Since the crack 40 develops along a direction substantially straight upwards from the top edge 19 of the side face 17 of the first layer pedestal 181, the side faces 17 of the first layer pedestal 181 are preferably disposed 50 µm or more inside the side faces 23 of the second layer pedestal 241, in plan view, and more preferably 100 µm or more inside thereof. When the side faces 17 of the first layer pedestal 181 and the side faces 23 of the second layer pedestal 241 are inclined, the top edge of the side faces 17 of the first layer pedestal 181 is preferably disposed 50 µm or more inside the bottom edge of the side faces 23 of the second layer pedestal 241, in plan view, and preferably 100 µm or more inside thereof.

Figure 2A:
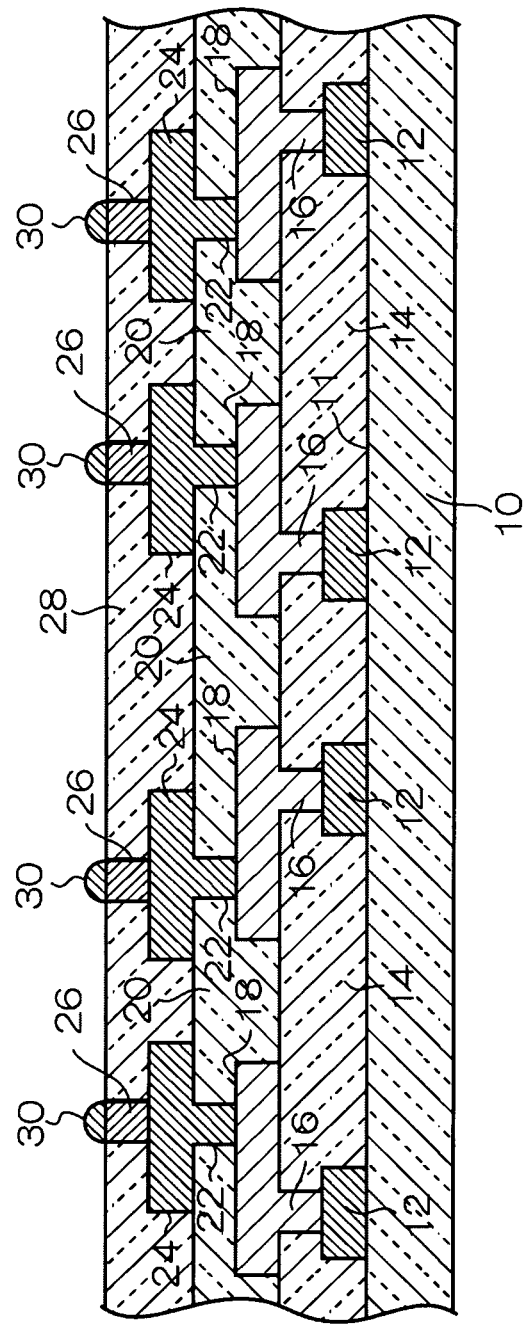

Next, explanation follows of a fabrication method of the wafer level chip size package 100 of the present exemplary embodiment, with reference to FIG. 2A and FIG. 2B.

As shown in FIG. 2A, the first inter-layer insulating film 14 is formed on the main face 11 of the wafer-shaped semiconductor silicon substrate 10 formed with elements (not shown in the figures) for configuring an integrated circuit, such as, for example, transistors or the like, and the electrode pads 12. Next, the through holes 16 are formed at the first inter-layer insulating film 14, exposing the electrode pads 12. Subsequently, the first redistribution wiring layer 18 is selectively formed on the first inter-layer insulating film 14. Then the second inter-layer insulating film 20 is formed on the first redistribution wiring layer 18. Subsequently, the through holes 22 are formed at the second inter-layer insulating film 20, exposing the first redistribution wiring layer 18. Then, the second redistribution wiring layer 24 is selectively formed on the second inter-layer insulating film 20. Subsequently, the post electrodes 26 are formed on the second layer pedestals 241 of the second redistribution wiring layer 24 (see FIG. 1A to FIG. 1C). Next the entire face is covered with the resin 28, and the surface of the post electrode 26 is subsequently exposed by machining. Subsequently, the solder electrodes 30 are formed from, for example, solder balls or the like, on the post electrodes 26.

Next, as shown in FIG. 2B, dicing is performed into individual chips, producing plural wafer level chip size packages 100.

Second Exemplary Embodiment

Figure 3A:
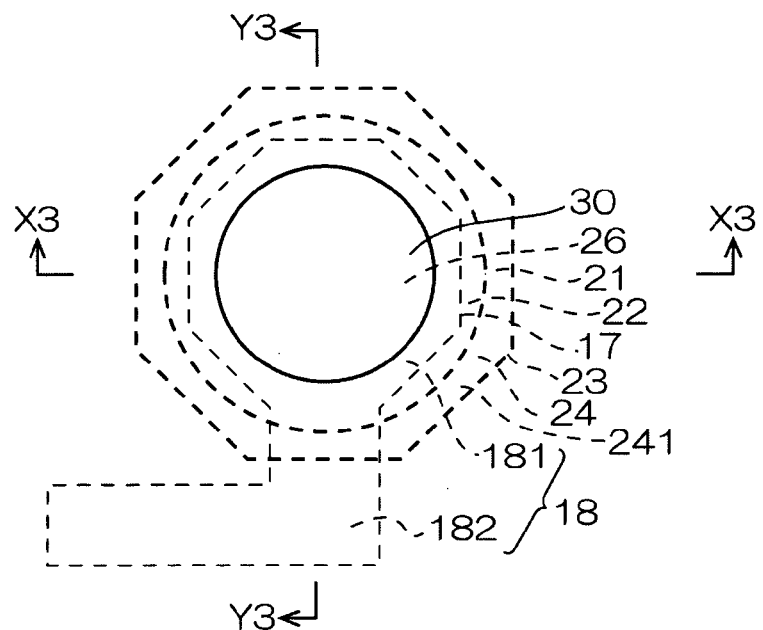
FIG. 3A is an outline plan view for explaining a semiconductor device of a second exemplary embodiment.
Figure 3B:
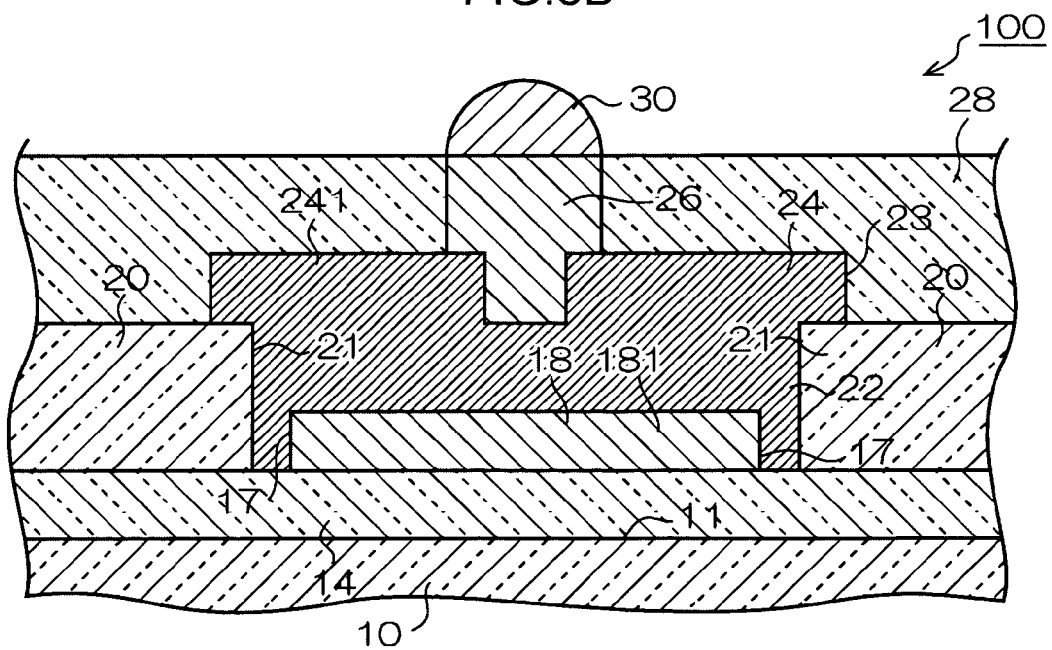
FIG. 3B is an outline vertical cross-section taken on line X3-X3 of FIG. 3A.
Figure 3C:
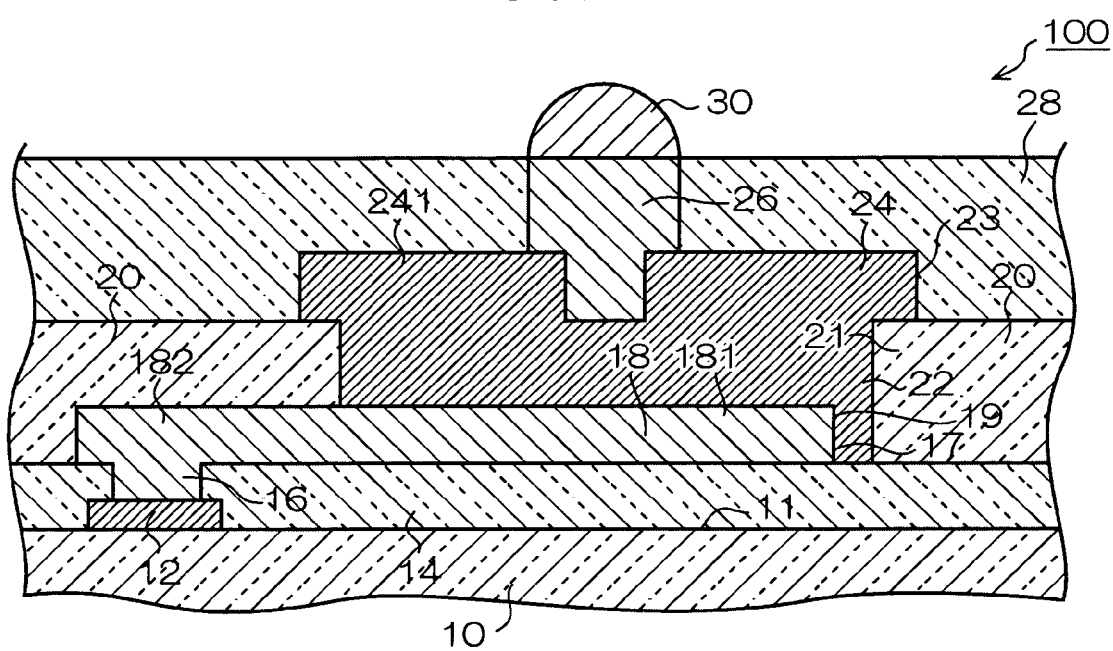
FIG. 3C is an outline vertical cross-section taken on line Y3-Y3 of FIG. 3A.

FIG. 3A is an outline plan view for explaining a semiconductor device of a second exemplary embodiment, FIG. 3B is an outline vertical cross-section taken on line X3-X3 of FIG. 3A, and FIG. 3C is an outline vertical cross-section taken on line Y3-Y3 of FIG. 3A.

In the present exemplary embodiment, the size of the through hole 22, provided in the second inter-layer insulating film 20 between the first layer pedestal 181 and the second layer pedestal 241, differs from that of the first exemplary embodiment. As a result of the different size of the through hole 22, the size of the second layer pedestal 241 plugging inside of the through hole 22 also differs from that of the first exemplary embodiment. Other parts of the configuration are similar to those of the first exemplary embodiment, and the fabrication method is also similar to that of the first exemplary embodiment.

In the present exemplary embodiment, in plan view, the surface area of the opening of the through hole 22 is larger than the surface area of the first layer pedestal 181, and the side faces 17 of the first layer pedestal 181 are located inside the side faces 21 of the through hole 22. By configuring the through hole 22 and the first layer pedestal 181 in this manner, the second inter-layer insulating film 20 is no longer present above the first layer pedestal 181, and cracks can be prevented from developing from the top edge 19 of the side faces 17 of the first layer pedestal 181.

Note that in the present exemplary embodiment, similarly to in the first exemplary embodiment, the first layer pedestal 181 is smaller than the second layer pedestal 241 and, in plan view, the side faces 17 of the first layer pedestal 181 are disposed inside the side faces 23 of the second layer pedestal 241. However, in the present exemplary embodiment, the opening area of the through hole 22 is greater than the surface area of the first layer pedestal 181, and the side faces 17 of the first layer pedestal 181 are disposed inside the side faces 21 of the through hole 22. Consequently, cracks can be prevented from developing from the top edge 19 of the side faces 17 of the first layer pedestal 181 if the second layer pedestal 241 is made the same size as the first layer pedestal 181 and also if the second layer pedestal 241 is made smaller than the first layer pedestal 181.

Comparative Example

Figure 4C:
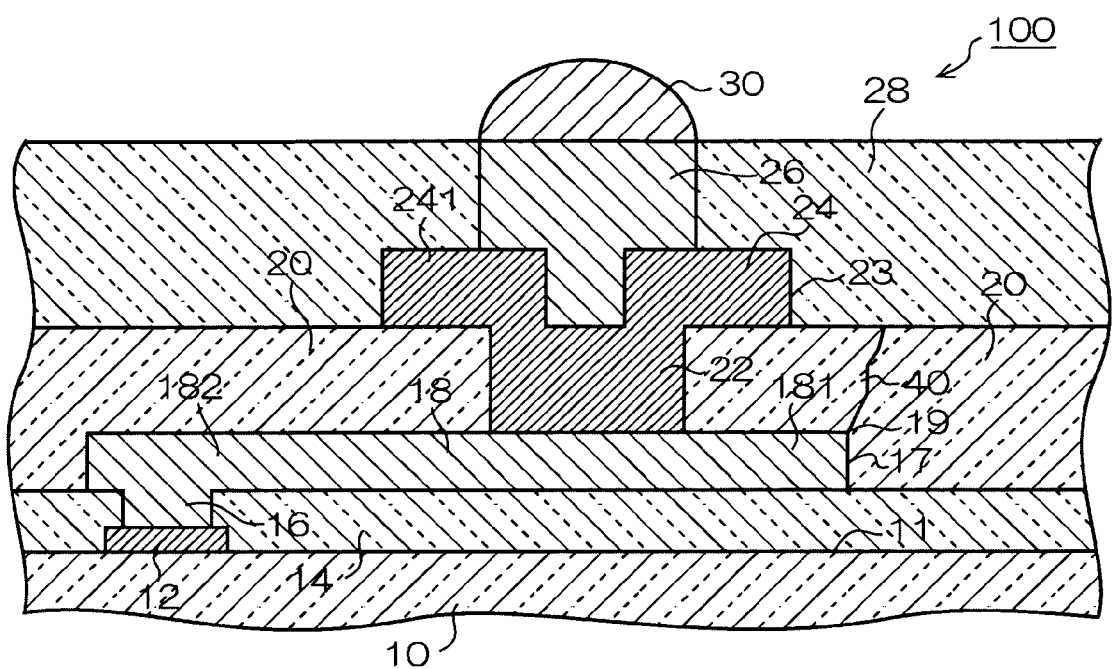
FIG. 4C is an outline vertical cross-section taken on line Y4-Y4 of FIG. 4A.

FIG. 4A is an outline plan view for explaining a wafer level chip size package of a comparative example, FIG. 4B is an outline vertical cross-section taken on line X4-X4 of FIG. 4A, and FIG. 4C is an outline vertical cross-section taken on line Y4-Y4 of FIG. 4A.

In a wafer level chip size package 100 of the comparative example, a first inter-layer insulating film 14 is provided on a semiconductor silicon substrate 10, a first redistribution wiring layer 18 is provided on the first inter-layer insulating film 14, a second inter-layer insulating film 20 is provided on the first redistribution wiring layer 18, and a second redistribution wiring layer 24 is provided on the second inter-layer insulating film 20.

A wiring line 182 and a first layer pedestal 181 are provided at the first redistribution wiring layer 18, and a second layer pedestal 241 is provided at the second redistribution wiring layer 24. One end of the wiring line 182 is connected to the electrode pad 12 exposed through a through hole 16 provided in the first inter-layer insulating film 14 and, the other end thereof is connected to the first layer pedestal 181.

The second layer pedestal 241 is provided directly above the first layer pedestal 181, with the second inter-layer insulating film 20 disposed therebetween. A through hole 22 is provided at the second inter-layer insulating film 20 between the first layer pedestal 181 and the second layer pedestal 241. The second layer pedestal 241 is smaller than the first layer pedestal 181, and, in plan view, the side faces 23 of the second layer pedestal 241 are disposed inside the side faces 17 of the first layer pedestal 181. The first layer pedestal 181 and the second layer pedestal 241 are both formed in octagonal shapes in plan view.

A post electrode 26 is provided on the second layer pedestal 241, the entire face is covered by a resin 28, and a solder electrode 30, made from, for example, a solder ball or the like, is formed on the post electrode 26 exposed through the resin 28.

In the wafer level chip size package 100 of the comparative example configured in this manner, sometimes a crack 40 develops in the second inter-layer insulating film 20 in a direction substantially straight up from a top edge 19 of the side faces 17 of the first layer pedestal 181. Such cracks 40 are thought to be generated during, for example, the thermal history of fabrication processes, due to the thermal expansion coefficients of the first redistribution wiring layer 18 (the first layer pedestal 181) and the second inter-layer insulating film 20 differing from each other. If the crack 40 is present, then this may sometimes lead to, for example, problems in moisture resistance or the like. Note that cracks do not develop in the second inter-layer insulating film 20 above the wiring line 182 of the first redistribution wiring layer 18, in contrast to above the first layer pedestal 181.

What is claimed is:

1. A semiconductor device comprising:
   a first insulating film provided on a horizontal top surface of a semiconductor substrate;
   a first pedestal provided at a first wiring layer on the first insulating film;
   a second insulating film provided on the first wiring layer; and
   a second pedestal provided at a second wiring layer on the second insulating film,
   wherein, when the first and second pedestals are projected in a direction perpendicular to the horizontal top surface onto a plane parallel to the horizontal top surface, an area of the second pedestal projected on the plane is larger than an area of the first pedestal projected on the plane, and the whole of the first pedestal projected on the plane is disposed at an inside of the second pedestal projected on the plane.

2. The semiconductor device of claim 1, further comprising: an external connection member provided on the second pedestal, wherein a through hole is provided in the second insulating film, and the first pedestal and the second pedestal are connected together by a conductive material provided within the through hole, and, when viewed from a direction perpendicular to the horizontal top surface, the external connection member is disposed directly above the through hole.

3. The semiconductor device of claim 2, wherein the conductive material is made of a conductive material of the second pedestal.

4. The semiconductor device of claim 2, wherein the external connection member includes a post electrode provided on the second pedestal.

5. The semiconductor device of claim 4, wherein the external connection member includes a solder bump provided on the post electrode.

6. The semiconductor device of claim 1, wherein a through hole is provided in the second insulating film, and the first pedestal and the second pedestal are connected together by a conductive material provided within the through hole, and, when viewed from a direction perpendicular to the horizontal top surface, a surface area of an opening of the through hole is larger than a surface area of the first pedestal, and a side face of the first pedestal is disposed inside a side face of the through hole.

7. A semiconductor device comprising:
   a first insulating film provided on a horizontal top surface of a semiconductor substrate;
   a first pedestal provided at a first wiring layer on the first insulating film;
   a second insulating film provided on the first wiring layer;
   a second pedestal provided at a second wiring layer on the second insulating film;
   a through hole provided at the second insulating film; and
   conductive material provided inside the through hole for connecting the first pedestal with the second pedestal,
   wherein, when the first pedestal and the through hole are projected in a direction perpendicular to the horizontal top surface onto a plane parallel to the horizontal top surface, a surface area of an opening of the through hole is greater than a surface area of the first pedestal, and a side face of the first pedestal is disposed inside a side face of the through hole.

8. A fabrication method of a semiconductor device, the method comprising:
   providing a first insulating film on a horizontal top surface of a semiconductor substrate;
   providing on the first insulating layer a first wiring layer that includes a plurality of first pedestals;
   providing a second insulating film on the first wiring layer;
   providing on the second insulating film a second wiring layer that includes a plurality of second pedestals;
   providing a plurality of external connection members on the plurality of second pedestals, respectively; and dividing the semiconductor substrate into a plurality of sections to produce a plurality of semiconductor devices, wherein, for each semiconductor device, when the first and second pedestals are projected in a direction perpendicular to the horizontal top surface onto a plane parallel to the horizontal top surface, an area of the second pedestal projected on the plane is larger than the first pedestal projected on the plane, and the whole of the first pedestal projected on the plane is disposed at an inside of the second pedestal projected on the plane.

9. The fabrication method of claim 8, further comprising:
providing a plurality of through holes in the second insulating film before providing the second wiring layer, the plurality of through holes respectively exposing the plurality of first pedestals,
wherein, for each semiconductor device, when viewed from a direction perpendicular to the horizontal top surface, the external connection member is disposed directly above the through hole.

* * * * *